(12) United States Patent
Haruta et al.

(10) Patent No.: US 10,950,412 B2
(45) Date of Patent: Mar. 16, 2021

(54) OBSERVATION METHOD, IMAGE PROCESSING DEVICE, AND ELECTRON MICROSCOPE

(71) Applicant: JEOL Ltd., Tokyo (JP)

(72) Inventors: Tomohiro Haruta, Tokyo (JP); Yuta Ikeda, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/788,752

(22) Filed: Feb. 12, 2020

(65) Prior Publication Data

US 2020/0266026 A1 Aug. 20, 2020

(30) Foreign Application Priority Data

Feb. 19, 2019 (JP) .............................. JP2019-027384

(51) Int. Cl.
*H01J 37/22* (2006.01)
*G02B 21/10* (2006.01)
(Continued)

(52) U.S. Cl.
CPC .............. *H01J 37/22* (2013.01); *G02B 21/10* (2013.01); *G02B 21/365* (2013.01); *H01J 37/244* (2013.01); *H01J 37/26* (2013.01)

(58) Field of Classification Search
CPC ............. H01J 37/22; H01J 2237/20292; H01J 37/244; H01J 37/26; H01J 37/226;
(Continued)

(56) References Cited

U.S. PATENT DOCUMENTS 6,545,276 B1 4/2003 Sasaki
7,851,753 B2 * 12/2010 Uto .................. G01N 21/95607
250/310
(Continued)

FOREIGN PATENT DOCUMENTS

JP 08162059 A * 6/1996
JP 8162059 A 6/1996
(Continued)

OTHER PUBLICATIONS

Extended European Search Report issued in EP 20156937.3 dated Jul. 10, 2020.
(Continued)

*Primary Examiner* — Michael Maskell
(74) *Attorney, Agent, or Firm* — The Webb Law Firm

(57) ABSTRACT

An observation method includes: preparing a specimen including, as a mark a plurality of metal particles in which localized surface plasmon resonance is excited by irradiation with light; acquiring an optical microscope image by photographing the specimen with an optical microscope; acquiring an electron microscope image by photographing the specimen with an electron microscope; acquiring information of the positions and the colors of the plurality of metal particles in the optical microscope image; acquiring information of the positions and the particle diameters of the plurality of metal particles in the electron microscope image; and determining information for associating the optical microscope image and the electron microscope image based on the information of the positions and the colors of the plurality of metal particles acquired from the optical microscope image, and the information of the positions and the particle diameters of the plurality of metal particles acquired from the electron microscope image.

15 Claims, 7 Drawing Sheets

(51) Int. Cl.
 *G02B 21/36* (2006.01)
 *H01J 37/244* (2006.01)
 *H01J 37/26* (2006.01)

(58) Field of Classification Search
 CPC .... G02B 21/10; G02B 21/365; G02B 21/367;
  G06K 9/3216; G06K 9/00134; G06K
  2009/3225; B82Y 30/00; G01N 1/30;
  G01N 1/28
 USPC ................................ 250/306, 307, 310, 311
 See application file for complete search history.

(56) References Cited

U.S. PATENT DOCUMENTS

| | | | |
|---|---|---|---|
| 2005/0237605 A1* | 10/2005 | Vodyanoy | G02B 21/16 |
| | | | 359/385 |
| 2008/0073524 A1* | 3/2008 | Nishiyama | G02B 21/0016 |
| | | | 250/307 |
| 2017/0042824 A1 | 2/2017 | Reinhard et al. | |

FOREIGN PATENT DOCUMENTS

| | | |
|---|---|---|
| JP | 2000298132 A | 10/2000 |
| JP | 201396939 A | 5/2013 |
| WO | 2015160597 A1 | 10/2015 |

OTHER PUBLICATIONS

Cardiff University, "Bio-Nano-Photonics 2017", Bio-Nano-Photonics, Sep. 2017; http:..www.bionanophoto.org.uk/.
Pope et al., "Correlative Light Electron Microscopy via Four Wave Mixing Imaging of Gold Nanoparticles", Sep. 2017; http://www.focusonmicroscopy.org/2017/PDF/1284_Corri.pdf.
Miles et al., "Direct Evidence of Lack of Colocalisation of Fluorescently Labelled Gold LAbels Used in Correlative Light Electron Microscopy", Scientific Reports, Mar. 20, 2017.
18th International Microscopy Congress, Sep. 7-12, 2014.
Arkill et al.; Correlative Light and Electron Microscopy Without Fluorescent Probes; Sep. 8, 2014.
Office Action issued in JP2019027384 dated Jan. 5, 2021.

\* cited by examiner

OBSERVATION METHOD, IMAGE PROCESSING DEVICE, AND ELECTRON MICROSCOPE

CROSS-REFERENCE TO RELATED APPLICATION

This application claims priority to Japanese Patent Application No. 2019-027384 filed Feb. 19, 2019, the disclosure of which is hereby incorporated by reference in its entirety.

BACKGROUND OF THE INVENTION

Field of the Invention

The present invention relates to an observation method, an image processing device, and an electron microscope.

Description of Related Art

A method which enables observation of the same part between an optical microscope and an electron microscope has been known (see, e.g., JP-A-8-162059).

Localization of the target cell or the target protein can be observed in optical microscope observation by labelling a specific cell, a specific protein, or the like with a fluorescent protein or a fluorescent dye. As such a fluorescent protein, green fluorescent protein (GFP) can be mentioned. As such fluorescent dyes, fluorescein isothiocyanate (FITC), DAPI (4′,6-diamidino-2-phenylindole), and the like can be mentioned.

However, the fluorescent proteins or the fluorescent dyes are incompatible with preparation of specimens for an electron microscope. For example, for fixing a specimen, glutaraldehyde, or osmium tetroxide is used. The fluorescent protein or the fluorescent dye loses fluorescence due to crosslinking by glutaraldehyde, or oxidation by osmium tetroxide. For this reason, it is difficult to perform optical microscope observation of a specimen labelled with a fluorescent protein or a fluorescent dye after fixing the specimen.

Alternatively, for example, a certain known method includes observing a specimen labelled with a fluorescent protein undergoing a DAB (3,3′-diaminobenzidine) reaction with an optical microscope, then fixing the specimen, and observing the specimen with an electron microscope. As such fluorescent proteins, ascorbic acid oxidase (APEX), mini singlet oxygen generator (miniSOG), and the like may be mentioned.

However, with this method, the specimen after fixing of the specimen cannot be subjected to optical microscope observation. For preparing a specimen for an electron microscope, the specimen is fixed, followed by substitution of an organic solvent for the moisture in the cell (dehydration), substitution of a resin for the organic solvent (resin embedding), and polymerization of the resin. When dehydration is performed, shrinkage of the specimen occurs. When polymerization of a resin is performed, shrinkage of the specimen due to shrinkage of the resin occurs. This makes the alignment between the optical microscope image and the electron microscope image difficult.

Further, as a fluorescent dye not affected by crosslinking or oxidation, a quantum dot including a semiconductor material is known. However, when transmission electron microscope observation is performed, a specimen must be sliced into thin pieces. Slicing of a specimen into thin pieces results in a decrease in amount of a fluorescent dye. For this reason, sufficient fluorescence signals cannot be obtained in optical microscope observation.

As described above, it was difficult to observe specimens in the same state with an optical microscope and an electron microscope.

SUMMARY

According to a first aspect of the invention, there is provided an observation method including:

preparing a specimen including, as a mark, a plurality of metal particles in which localized surface plasmon resonance is excited by irradiation with light;

acquiring an optical microscope image by photographing the specimen with an optical microscope;

acquiring an electron microscope image by photographing the specimen with an electron microscope;

acquiring information of the positions and the colors of the plurality of metal particles in the optical microscope image;

acquiring information of the positions and the particle diameters of the plurality of metal particles in the electron microscope image; and determining information for associating the optical microscope image and the electron microscope image based on the information of the positions and the colors of the plurality of metal particles acquired from the optical microscope image, and the information of the positions and the particle diameters of the plurality of metal particles acquired from the electron microscope image.

According to a second aspect of the invention, there is provided an image processing device including:

an image acquisition unit that acquires an optical microscope image of a specimen including, as a mark, a plurality of metal particles in which localized surface plasmon resonance is excited by irradiation with light, and an electron microscope image of the specimen;

a first image information acquisition unit that acquires information of the positions and the colors of the plurality of metal particles in the optical microscope image;

a second image information acquisition unit that acquires information of the positions and the particle diameters of the plurality of metal particles in the electron microscope image; and a computation unit that determines information for associating the optical microscope image and the electron microscope image based on the information of the positions and the colors of the plurality of metal particles acquired from the optical microscope image, and the information of the positions and the particle diameters of the plurality of metal particles acquired from the electron microscope image.

According to a third aspect of the invention, there is provided an electron microscope including the above image processing device.

Figure 1:
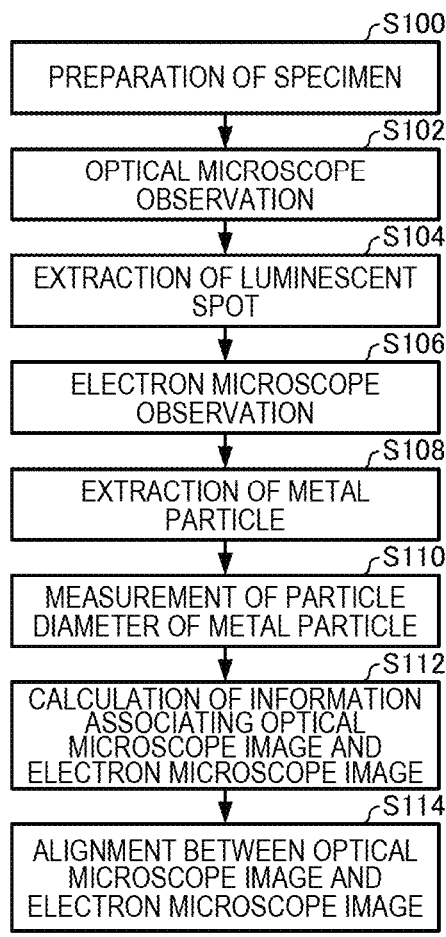
FIG. 1 is a flowchart illustrating one example of an observation method in accordance with a first embodiment.

DESCRIPTION OF THE INVENTION (1) According to an embodiment of the invention, there is provided an observation method including:

preparing a specimen including, as a mark, a plurality of metal particles in which localized surface plasmon resonance is excited by irradiation with light;

acquiring an optical microscope image by photographing the specimen with an optical microscope;

acquiring an electron microscope image by photographing the specimen with an electron microscope;

acquiring information of the positions and the colors of the plurality of metal particles in the optical microscope image;

acquiring information of the positions and the particle diameters of the plurality of metal particles in the electron microscope image; and determining information for associating the optical microscope image and the electron microscope image based on the information of the positions and the colors of the plurality of metal particles acquired from the optical microscope image, and the information of the positions and the particle diameters of the plurality of metal particles acquired from the electron microscope image.

With such an observation method, a plurality of metal particles in which localized surface plasmon resonance is excited by irradiation with light are used as a mark. The plurality of metal particles function as a mark in both of an optical microscope image and an electron microscope image without being affected by preparation of a specimen for an electron microscope. Therefore, with such an observation method, with an optical microscope and an electron microscope, a specimen in the same state can be observed. Further, with such an observation method, a particle diameter of a metal particle can be estimated from the color of a luminescent spot in an optical microscope image. Therefore, metal particles of an optical microscope image and metal particles of an electron microscope image can be readily associated with each other. Accordingly, it is possible to achieve alignment between an optical microscope image and an electron microscope image with precision.

(2) According to an embodiment of the invention, there is provided an image processing device including:

an image acquisition unit that acquires an optical microscope image of a specimen including, as a mark, a plurality of metal particles in which localized surface plasmon resonance is excited by irradiation with light, and an electron microscope image of the specimen;

a first image information acquisition unit that acquires information of the positions and the colors of the plurality of metal particles in the optical microscope image;

a second image information acquisition unit that acquires information of the positions and the particle diameters of the plurality of metal particles in the electron microscope image; and a computation unit that determines information for associating the optical microscope image and the electron microscope image based on the information of the positions and the colors of the plurality of metal particles acquired from the optical microscope image, and the information of the positions and the particle diameters of the plurality of metal particles acquired from the electron microscope image.

With such an image processing device, a particle diameter of a metal particle can be estimated from the color of a luminescent spot in an optical microscope image. Therefore, metal particles of an optical microscope image and metal particles of an electron microscope image can be readily associated with each other. Accordingly, it is possible to achieve alignment between an optical microscope image and an electron microscope image with precision.

(3) According to an embodiment of the invention, there is provided an electron microscope including the above image processing device.

With such an electron microscope, a particle diameter of a metal particle can be estimated from the color of a luminescent spot in an optical microscope image. Therefore, metal particles of an optical microscope image and metal particles of an electron microscope image can be readily associated with each other. Accordingly, it is possible to achieve alignment between an optical microscope image and an electron microscope image with precision.

Embodiments of the invention are described in detail below with reference to the drawings. Note that the following embodiments do not unduly limit the scope of the invention as stated in the claims. In addition, all of the elements described below are not necessarily essential requirements of the invention.

1. First Embodiment

First, an observation method in accordance with a first embodiment will be described. FIG. 1 is a flowchart illustrating one example of the observation method in accordance with the first embodiment.

(1) Preparation of Specimen (S100)

Figure 2:
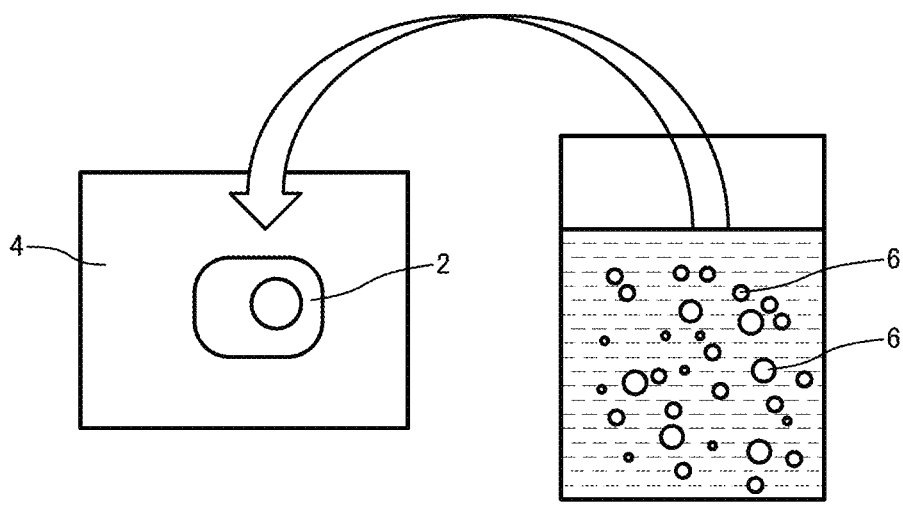
FIG. 2 is a diagram for illustrating a process of preparing a specimen in the observation method in accordance with the first embodiment.

FIG. 2 is a diagram for illustrating a process of preparing a specimen in the observation method in accordance with the first embodiment.

First, an observation target 2 is prepared. The observation target 2 is, for example, a biological specimen. Then, the observation target 2 is fixed, followed by resin embedding. Then, the observation target 2 embedded in resin is sliced into thin pieces by a microtome, or the like. A section of the observation target 2 is thus obtained. The process and the order of the pretreatments such as fixing, dyeing, and resin embedding with respect to the observation target 2 are not particularly restricted.

Then, the section of the observation target 2 is placed on a supporting film 4. The supporting film 4 is a very thin film of a polymer, carbon, or the like. Then, an aqueous solution including a plurality of metal particles 6 having different particle diameters is prepared. The resulting aqueous solution including the metal particles 6 is added dropwise on the supporting film 4, and is dried. The plurality of metal particles 6 can be thus placed on the supporting film 4.

A specimen can be prepared by the above treatments.

In the first embodiment, as the mark for identifying the observation position, the metal particle 6 in which localized surface plasmon resonance is excited by irradiation with light is used. The particle diameter of the metal particle 6 is, for example, 20 nm or more and 1 μm or less. The shape of the metal particle 6 is, for example, a spherical shape.

The reason why the metal particle 6 is used as the mark will be described below.

The oscillation of electrons due to localized surface plasmon resonance depends upon the particle diameter or the surface structure of the particle. A light with a specific wavelength is intensely absorbed or scattered by the oscillation of electrons due to localized surface plasmon resonance. By absorption or scattering of light with a specific wavelength due to localized surface plasmon resonance, the nano-size metal particle 6 can be observed in optical microscope observation. Further, localized surface plasmon resonance changes the wavelength of the light to be absorbed depending upon the type, the particle diameter, the surface structure of the metal particle, and the like. For this reason, the particle diameter of the metal particle 6 can be estimated from the color of the scattered light from the metal particle 6 in optical microscope observation.

Further, use of the metal particles 6 as the mark can provide absorption scattering contrast in electron microscope observation. Accordingly, a sufficient contrast can be obtained as the mark in the electron microscope image.

As the metal particles 6, gold particles are preferable. Gold particles are not corroded by an acid or an alkali except for aqua regia. Further, gold particles show low cytotoxicity, and is unlikely to exert an adverse effect even when placed in the cell. As the gold particles, Gold NanoUrchin may be used. Alternatively, as the metal particles 6, particles of an alloy of gold and silver may be used.

(2) Optical Microscope Observation (S102)

Then, the prepared specimen is observed by an optical microscope. With optical microscope observation, a dark-field image is observed. Namely, with optical microscope observation, a scattered light from the specimen is observed. With an optical microscope, the dark-field image is photographed by a camera capable of color photographing so that the color of the scattered light from the metal particles 6 can be checked. When the scattered light from the specimen can be checked, a bright-field image may be observed with the optical microscope observation.

Figure 3:
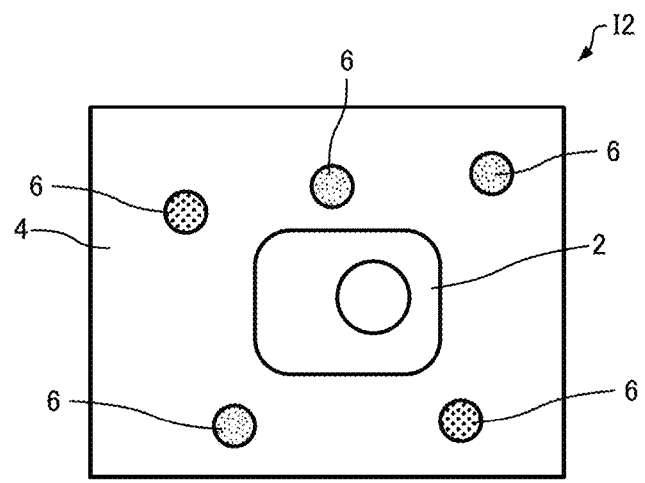
FIG. 3 schematically illustrates an optical microscope image of a specimen.

FIG. 3 schematically illustrates an optical microscope image 12 (dark-field image) of a specimen. In FIG. 3, the color of the scattered light from each metal particle 6 is expressed by hatching for convenience. Namely, the metal particles 6 with the same hatching indicate scattered light of the same color.

As illustrated in FIG. 3, in an optical microscope image 12, a scattered light from each metal particle 6 is observed. In the dark-field image of an optical microscope, even a scattered light from the metal particles 6 as small as about 20 nm can be observed due to the effect of localized surface plasmon resonance. In the optical microscope image 12, the scatted light from each metal particle 6 is observed as a luminescent spot.

(3) Extraction of Luminescent Spot (S104)

Then, a luminescent spot is extracted from the optical microscope image 12. Namely, the metal particles 6 are extracted from the optical microscope image 12. Specifically, the coordinates (X, Y) of each luminescent spot, and the information of the color of each luminescent spot are acquired from the optical microscope image 12. The coordinates (X, Y) of the luminescent spot and the information of the color of the luminescent spot can be said to be information on the coordinates of the metal particles and the color of the metal particles (the color of a scattered light from the metal particles) in the optical microscope image.

Figure 4:
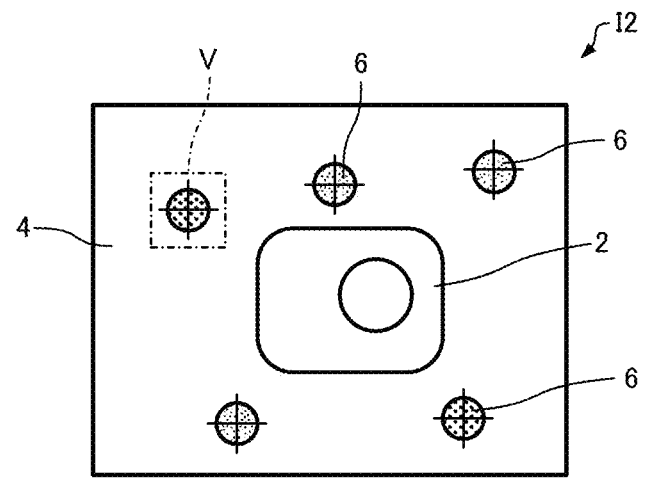
FIG. 4 is a diagram for illustrating a process of determining coordinates of a luminescent spot.
Figure 5:
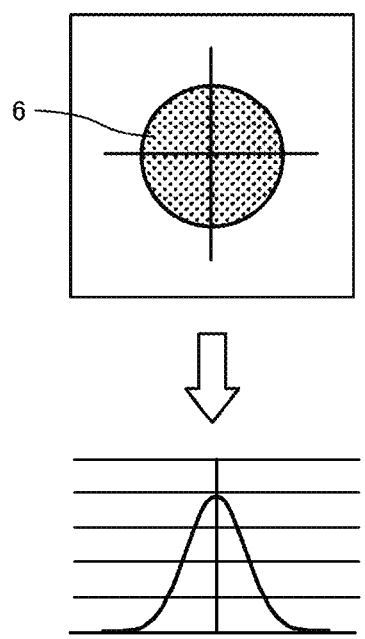
FIG. 5 is a diagram for illustrating a process of determining coordinates of a luminescent spot.

FIGS. 4 and 5 are each a diagram for illustrating a process of determining the coordinates of the luminescent spot. FIG. 5 illustrates an enlarged view of a region V of FIG. 4, and an intensity profile of the luminescent spot. The horizontal axis of the graph in FIG. 5 indicates the position of the optical microscope image, and the vertical axis indicates the brightness.

As illustrated in FIG. 5, it is assumed that the brightness of the luminescent spot is normally distributed, and it is assumed that the center of the luminescent spot in the optical microscope image 12 has the coordinates (X, Y) of the luminescent spot. The information of the coordinates (X, Y) of the luminescent spot is recorded as the coordinates (X, Y) of the metal particles; and the information of the color of the luminescent spot, as the information of the color of the metal particles. At this step, the coordinates (X, Y) of the metal particles and the information of the color of the metal particles are recorded in association with each other.

(4) Electron Microscope Observation (S106)

Then, the prepared specimen is observed with a transmission electron microscope. The observation by a transmission electron microscope may be performed in a dark field mode or may be performed in a bright field mode.

Figure 6:
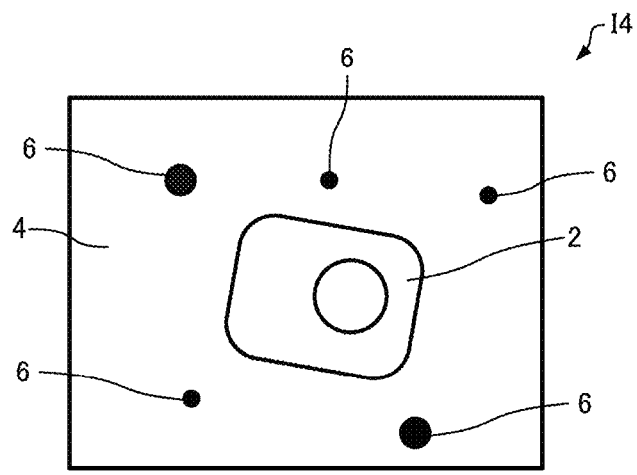
FIG. 6 schematically illustrates a transmission electron microscope image of a specimen.

FIG. 6 schematically illustrates a TEM image 14 (bright field image) of the specimen. As illustrated in FIG. 6, an electron beam is absorbed and scattered by the metal particles 6. For this reason, in the TEM image 14, the metal particles 6 are observed as black dots.

(5) Extraction of Metal Particles (S108)

Then, in the TEM image 14, each metal particle 6 is extracted. The metal particles 6 are observed as black dots in the TEM image 14. For this reason, the coordinates of the centers of the black dots are assumed to be the coordinates (x, y) of the metal particles 6.

(6) Measurement of Particle Diameter of Metal Particles (S110)

Then, in the TEM image 14, a particle diameter (diameter) of the metal particles 6 is measured.

Figure 7:
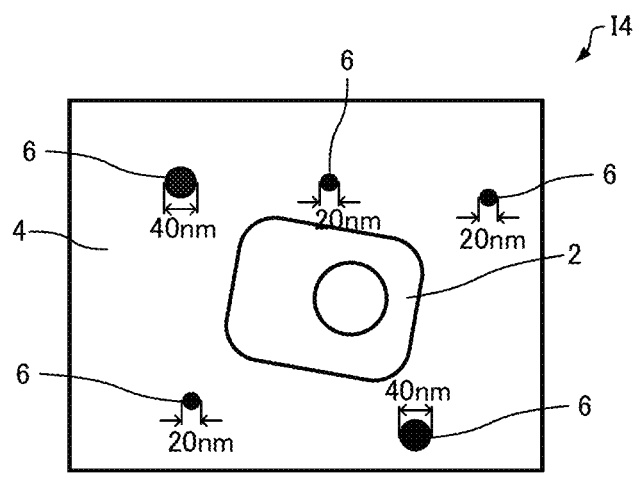
FIG. 7 is a diagram for illustrating measurement of a particle diameter of a metal particle.

FIG. 7 is a diagram for illustrating measurement of a particle diameter of the metal particles 6.

As illustrated in FIG. 7, in the TEM image 14, a particle diameter of each metal particle 6 is measured. The information of a particle diameter of the metal particles 6 is recorded in association with the information of the coordinates (x, y) of the metal particles 6.

(7) Calculation of Information for Associating Optical Microscope Image and Electron Microscope Image (S112)

Then, information for associating the optical microscope image 12 and the TEM image 14 is determined. The information for associating the optical microscope image 12 and the TEM image 14 can be determined based on the information of each position and each color of a plurality of metal particles 6 acquired from the optical microscope image, and the information of each position and each particle diameter of a plurality of metal particles 6 acquired from the TEM image.

The color of the metal particles 6 in the optical microscope image 12, namely, the color of a scattered light from the metal particles 6 depends upon the particle diameters of the metal particles 6. Specifically, with an increase in particle diameters of the metal particles 6, a light with a long wavelength is more absorbed by the metal particles 6 due to localized surface plasmon resonance. For this reason, from the information of the color (wavelength of the light) of the metal particles 6 acquired from the optical microscope image, the particle diameter of the metal particles 6 can be estimated. Using this, the particle diameter of the metal particles 6 and the position of the metal particles 6 are checked by comparison between two images. This can associate the metal particles 6 observed in the optical microscope image 12 and the metal particles 6 observed in the TEM image 14.

In this manner, the corresponding metal particles 6 between the two images are found. This indicates that the coordinates (X, Y) of the metal particles 6 in the optical microscope image 12 and the coordinates (x, y) of the metal particles 6 in the TEM image 14 indicate the same position on the specimen. As a result, it is possible to obtain the information for associating the optical microscope image 12 and the TEM image 14.

Figure 8:
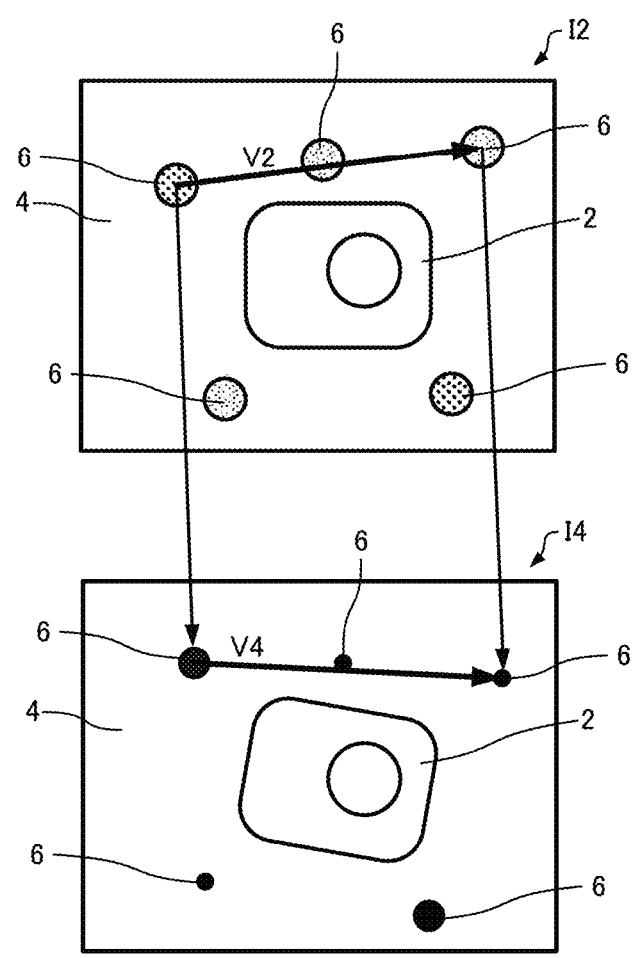
FIG. 8 is a diagram for illustrating a process of determining information for associating an optical microscope image and a transmission electron microscope image.
Figure 9:
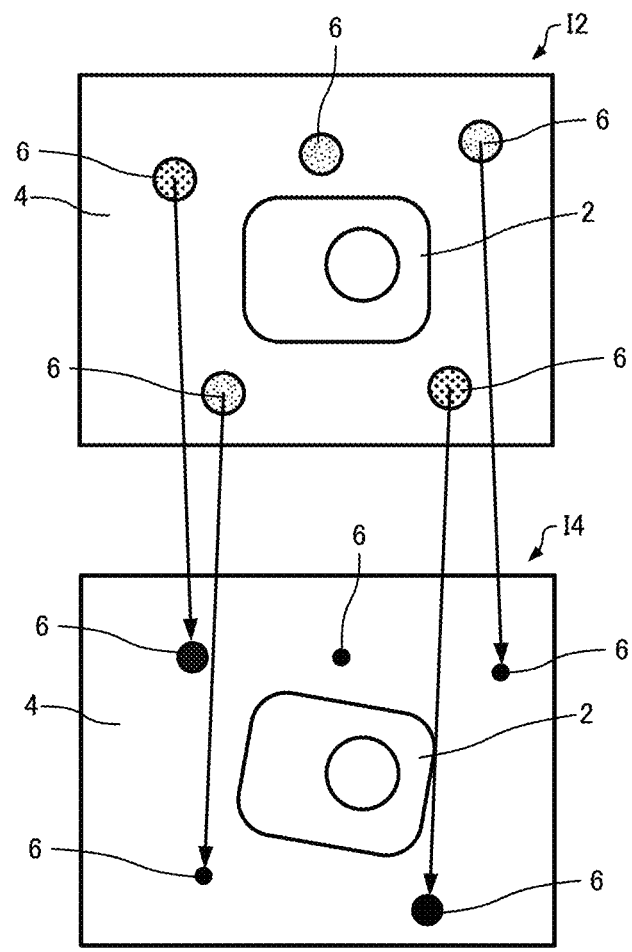
FIG. 9 is a diagram for illustrating a process of determining information for associating an optical microscope image and a transmission electron microscope image.

FIGS. 8 and 9 are each a diagram for illustrating a process of determining the information for associating the optical microscope image 12 and the TEM image 14.

For example, when two pairs of corresponding metal particles 6 between the optical microscope image 12 and the TEM image 14 are found as illustrated in FIG. 8, the difference in magnification and the difference in direction between the optical microscope image 12 and the TEM image 14 can be determined. For example, as illustrated in FIG. 8, a vector V2 connecting two metal particles 6 is drawn in the optical microscope image 12. Similarly, a vector V4 connecting two metal particles 6 is drawn in the TEM image 14. Thus, it is possible to determine the difference in magnification between the two images from the difference between the length of the vector V2 and the length of the vector V4. Further, it is possible to determine the difference in direction between the two images from the direction of the vector V2 and the direction of the vector V4. The difference in direction between the two images can be expressed as, for example, the angle formed by the vector V2 and the vector V4.

Further, for example, when three or more pairs of the corresponding metal particles 6 between the microscope image 12 and the TEM image 14 are found as illustrated in FIG. 9, it is possible to determine the distortion of the image in addition to the difference in magnification and the difference in direction between the optical microscope image 12 and the TEM image 14. In the example illustrated in FIG. 9, there are four pairs of the corresponding metal particles 6 between the optical microscope image 12 and the TEM image 14. For this reason, it is possible to determine the difference in magnification, the difference in direction, and the distortion of the image.

The aberration of the optical system in an optical microscope and the aberration of the optical system in an electron microscope are different from each other. For this reason, for example, when the optical microscope image 12 is used as the standard, the TEM image 14 is distorted with respect to the optical microscope image 12. As described above, when three or more pairs of the corresponding metal particles 6 between the optical microscope image 12 and the TEM image 14 are found, it is possible to determine how the TEM image 14 is distorted with respect to the optical microscope image 12. Alternatively, how the optical microscope image 12 is distorted with respect to the TEM image 14 with reference to the TEM image 14 may be determined, for example.

(8) Alignment Between Optical Microscope Image and TEM Image (S114)

Then, based on the information for associating the optical microscope image 12 and the TEM image 14, alignment between the optical microscope image 12 and the TEM image 14 is performed, so that the optical microscope image 12 and the TEM image 14 are superimposed together, to form a single image.

For example, the magnifications of the optical microscope image 12 and the TEM image 14 are adjusted first based on the information of the difference in magnification between the optical microscope image 12 and the TEM image 14. As a result, the magnifications of the optical microscope image 12 and the TEM image 14 are equalized. Further, based on the information of the difference in direction between the optical microscope image 12 and the TEM image 14, the directions of the optical microscope image 12 and the TEM image 14 are adjusted. For example, the direction can be adjusted by rotating the TEM image 14 with respect to the optical microscope image 12. As a result, the optical microscope image 12 and the TEM image 14 are aligned to the same direction. Further, based on the information of distortion between the two images, the distortion between the optical microscope image 12 and the TEM image 14 may be corrected.

Then, alignment between the optical microscope image 12 adjusted in magnification, direction, and the like, and the TEM image 14 adjusted in magnification, direction, and the like is performed, so that the optical microscope image 12 and the TEM image 14 are superimposed together, to form a single image.

Figure 10:
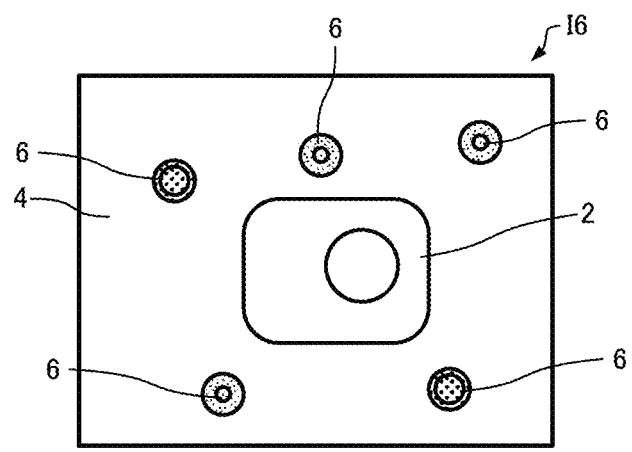
FIG. 10 schematically illustrates an image formed by superimposing an optical microscope image on a transmission electron microscope image.

FIG. 10 schematically illustrates the image 16 generated by superimposing the optical microscope image 12 on the TEM image 14.

The image 16 illustrated in FIG. 10 becomes an image utilizing the characteristics of both of the optical microscope image 12 and the TEM image 14.

By the above process, the specimen can be observed by combining the optical microscope and the transmission electron microscope.

In the above description, a description has been given to the case where the optical microscope image and the TEM image are acquired. However, it is essential only that the image to be combined with the optical microscope image is an electron microscope image. Herein, the electron microscope images include a TEM image, a scanning electron microscope image (SEM image), and a scanning transmission electron microscope image (STEM image). Also with the SEM image and the STEM image, the particle diameter of the metal particles 6 can be measured as with the TEM image. For this reason, even when a microscope image and a SEM image are acquired, and when an optical microscope image and a STEM image are acquired, a specimen can be observed by the same treatment as that for acquiring an optical microscope image and a TEM image.

Further, in the above description, a description has been given to the case where the observation target is a biological specimen. However, also for other specimens, as with the case of the biological specimen, observation with a combination of an optical microscope and an electron microscope is possible.

The observation method in accordance with the first embodiment has, for example, the following features.

The observation method in accordance with the first embodiment includes the steps of: preparing a specimen including, as a mark, a plurality of metal particles in which localized surface plasmon resonance is excited by irradiation with light; acquiring information of positions and colors of the plurality of metal particles in an optical microscope image; acquiring information of positions and particle diameters of the plurality of metal particles in an electron microscope image; and determining information for associating the optical microscope image and the electron microscope image based on the information of the positions and the colors of the plurality of metal particles acquired from the optical microscope image, and the information of the positions and the particle diameters of the plurality of metal particles acquired from the electron microscope image.

With the observation method in accordance with the first embodiment, a plurality of metal particles 6 in which localized surface plasmon resonance is excited by irradiation with light are used as a mark. The plurality of metal particles 6 function as a mark for both of the optical microscope image and the electron microscope image without being affected by preparation of a specimen for an electron microscope. Therefore, in the observation method in accordance with the first embodiment, a specimen in the same state can be observed with an optical microscope and an electron microscope.

Further, in the observation method in accordance with the first embodiment, the particle diameter of the metal particles can be estimated from the color of the luminescent spot in the optical microscope image. Therefore, the metal particles of the optical microscope image and the metal particles of the electron microscope image can be readily associated with each other. Accordingly, it is possible to achieve alignment between the optical microscope image and the electron microscope image with precision.

With the observation method in accordance with the first embodiment, the optical microscope image is, for example, a dark-field image. With a dark-field image, the color of a scattered light from the metal particles 6 is easy to see. For this reason, it is possible to estimate the particle diameter of the metal particles 6 from the optical microscope image with precision.

2. Second Embodiment

Figure 11:
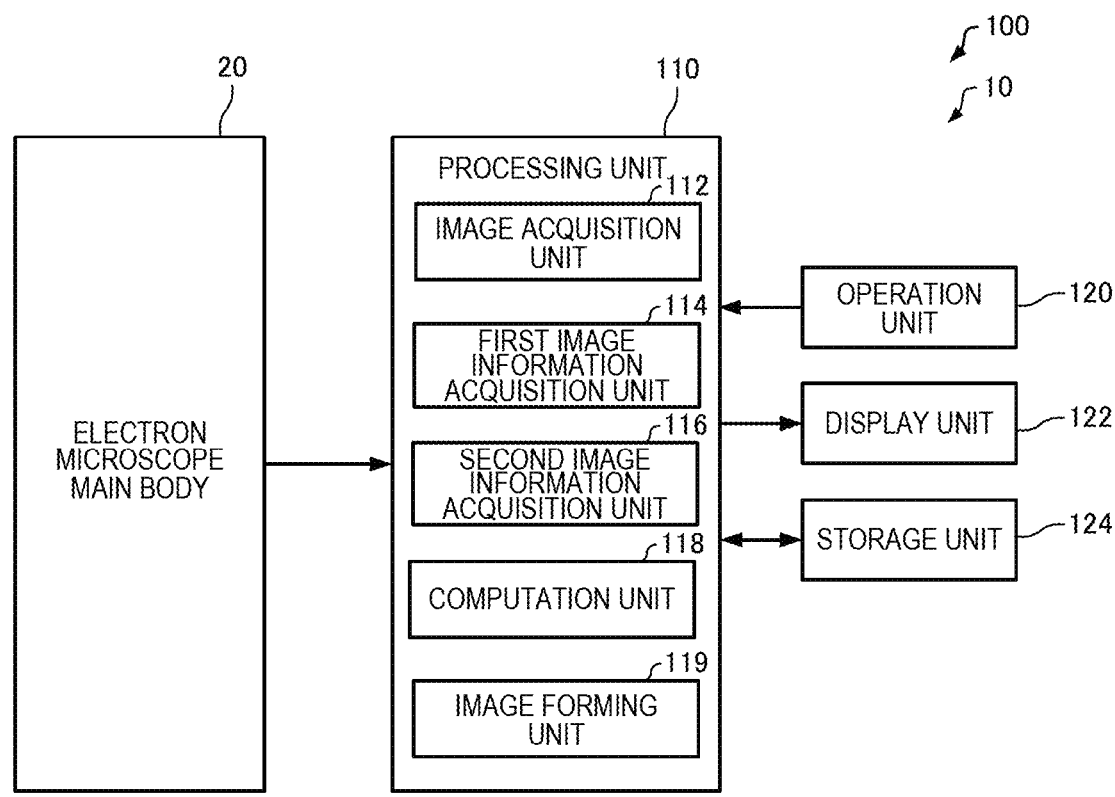
FIG. 11 is a diagram illustrating a configuration of an electron microscope.

Then, an image processing device in accordance with a second embodiment will be described by reference to the accompanying drawings. FIG. 11 is a diagram illustrating a configuration of an electron microscope 100. The electron microscope 100 includes an image processing device 10 in accordance with the second embodiment.

The electron microscope 100 includes the image processing device 10 and an electron microscope main body 20.

The electron microscope main body 20 has, for example, a function as a transmission electron microscope. The electron microscope main body 20 includes an electron gun, an irradiation system for irradiating a specimen with an electron beam, a specimen stage for holding a specimen, an imaging system for imaging an image by electrons transmitted through the specimen, and a photographing device for photographing an image. With the electron microscope main body 20, the electron beams emitted from the electron gun are converged by the irradiation system, and are applied to the specimen. The electron beam applied to the specimen is transmitted through the specimen. By the imaging system, a TEM image is imaged by the electrons transmitted through the specimen, and the TEM image is photographed by the photographing device. The image data of the TEM image photographed by the photographing device is sent to the image processing device 10, and is stored at a storage unit 124.

The image processing device 10 includes an operation unit 120, a display unit 122, the storage unit 124, and a processing unit 110.

The operation unit 120 performs processing of acquiring an operation signal in response to the operation by a user, and sending the operation signal to the processing unit 110. The function of the operation unit 120 can be achieved by, for example, a button, a key, a touch panel type display, or a microphone.

The display unit 122 is for displaying the image generated by the processing unit 110. The function of the display unit 122 can be achieved by, for example, a display such as a liquid crystal display (LCD).

The storage unit 124 stores a program, data, and the like for the processing unit 110 to perform a variety of calculation processing and control processing. Further, the storage unit 124 is used as the work area of the processing unit 110, and is also used for temporarily storing the results of calculation executed by the processing unit 110 in accordance with various programs, and the like. The function of the storage unit 124 can be implemented by, for example, a random access memory (RAM), a read only memory (ROM), and a hard disk.

The processing unit 110 performs various control processing and calculation processing in accordance with the program stored in the storage unit 124. The function of the processing unit 110 can be implemented by executing a program by various processors (central processing unit (CPU), and the like). The processing unit 110 includes an image acquisition unit 112, a first image information acquisition unit 114, a second image information acquisition unit 116, a computation unit 118, and an image forming unit 119.

The image acquisition unit 112 acquires an optical microscope image of a specimen including, as a mark, a plurality of metal particles in which localized surface plasmon resonance is excited by irradiation with light, and the electron microscope image of the specimen. For example, a user photographs the specimen using an optical microscope, and the resulting optical microscope image 12 (see FIG. 3) is stored in the storage unit 124. The image acquisition unit 112 reads the optical microscope image 12 stored in the storage unit 124, and acquires the optical microscope image 12. Further, the image acquisition unit 112 reads, for example, the TEM image 14 (see FIG. 6) photographed by the electron microscope main body 20, and stored in the storage unit 124, and acquires the TEM image 14.

The first image information acquisition unit 114 acquires the information of the positions and the colors of a plurality of metal particles in the optical microscope image 12. The first image information acquisition unit 114 extracts a luminescent spot in the optical microscope image 12, and acquires the information of the coordinates of the luminescent spot and the color of the luminescent spot. As a result, the information of the position and the color of each metal particle can be acquired. The information of the position and the color of each metal particle is recorded in the storage unit 124.

The second image information acquisition unit 116 acquires the information of the position and the particle diameter of each of the plurality of metal particles in the TEM image 14. The second image information acquisition unit 116 extracts the portion of the contrast corresponding to the metal particles 6 from the TEM image 14. For example, when the TEM image 14 is a bright field image, the metal particles 6 are observed as a black dot. For this reason, the second image information acquisition unit 116 acquires the information of the coordinates of the black dot and the particle diameter of the black dot. As a result, the information of the position and the particle diameter of each metal particle can be acquired. The information of the position and the particle diameter of each metal particle is recorded in the storage unit 124.

The computation unit 118 determines the information for associating the optical microscope image 12 and the TEM image 14 based on the information of the positions and the colors of the plurality of metal particles 6 acquired from the optical microscope image 12, and the information of the positions and the particle diameters of the plurality of metal particles acquired from the TEM image 14. The information for associating the optical microscope image 12 and the TEM image 14 includes the information of the positions of the corresponding metal particles 6 between the two images, the information of the difference in magnification between the two images, and the information of the difference in direction between the two images. Further, information for associating the optical microscope image 12 and the TEM image 14 may include the information of the distortion between the two images.

The computation unit 118 determines the information of the positions of the corresponding metal particles 6 between the optical microscope image 12 and the TEM image 14. Specifically, the computation unit 118 estimates the particle diameter of the metal particles 6 from the information of the color of the metal particles 6 in the optical microscope image 12. The computation unit 118 estimates the particle diameter of the metal particles 6 from the color of the metal particles 6 using the table showing the relationship between the particle diameter of the metal particles 6 and the color of a scattered light from the metal particles. The computation unit 118 checks the information of the estimated particle diameter and position of the metal particles 6 against the information of the particle diameter and the position of the metal particles 6 in the TEM image 14, and founds the corresponding metal particles 6 between the two images.

The computation unit 118 determines the difference in magnification between two images from the difference in length between the vector V2 connecting two metal particles 6 in the optical microscope image 12 and the vector V4 connecting two metal particles 6 in the TEM image 14, for example, as illustrated in FIG. 8. Further, the computation unit 118 determines the difference in direction between two images from the direction of the vector V2 and the direction of the vector V4.

Further, the computation unit 118 determines the distortion of the TEM image 14 with respect to the optical microscope image 12 when there are three or more pairs of corresponding metal particles 6 between two images. The distortion of the optical microscope image 12 with respect to the TEM image 14 may be determined.

The image forming unit 119 performs alignment between the optical microscope image 12 and the TEM image 14 based on the information for associating the optical microscope image 12 and the TEM image 14, and forms a single image obtained by superimposing the optical microscope image 12 on the TEM image 14.

The image forming unit 119 equalizes the magnifications of the optical microscope image 12 and the TEM image 14 based on the information of the difference in magnification between the optical microscope image 12 and the TEM image 14. Further, the image forming unit 119 equalizes the directions of the optical microscope image 12 and the TEM image 14 based on the information of the difference in direction between the optical microscope image 12 and the TEM image 14. Still further, when the information of the distortion of the TEM image 14 with respect to the optical microscope image 12 is obtained, the distortion between the optical microscope image 12 and the TEM image 14 is corrected. The image forming unit 119 performs alignment between the optical microscope image 12 and the TEM image 14 thus equalized in magnification and direction, and superimposes the optical microscope image 12 on the TEM image 14 to form a single image 16 (see FIG. 10). The image forming unit 119 allows the formed image 16 to be displayed on the display unit 122.

The image processing device 10 has, for example, the following features.

With the image processing device 10, the computation unit 118 determines the information for associating the optical microscope image and the electron microscope image based on the information of the positions and the colors of a plurality of metal particles acquired from the optical microscope image, and the information of the positions and the particle diameters of a plurality of metal particles acquired from the electron microscope image. In this manner, with the image processing device 10, a plurality of metal particles 6 in which localized surface plasmon resonance is excited by irradiation with light are used as a mark. For this reason, with optical microscope observation, the particle diameter of the metal particles can be estimated with the color of the luminescent spot. Therefore, with the image processing device 10, the metal particles of the optical microscope image and the metal particles of the electron microscope image can be readily associated with each other. Accordingly, it is possible to perform alignment between the optical microscope image and the electron microscope image with precision.

With the image processing device 10, the image forming unit 119 performs alignment between the optical microscope image and the electron microscope image based on the information for associating the optical microscope image and the electron microscope image, and forms a single image obtained by superimposing the optical microscope image on the electron microscope image. For this reason, with the image processing device 10, it is possible to obtain an image utilizing the characteristics of both of the optical microscope image 12 and the TEM image 14.

3. Modified Example

Below, the different point from the observation method in accordance with the first embodiment will be described, and the same points will not be described.

In the first embodiment, the aqueous solution including the metal particles 6 was added dropwise to the section of the observation target 2 on the supporting film 4, and was dried. As a result, the metal particles 6 were placed on the supporting film 4. The process of preparing a specimen including a plurality of metal particles 6 is not limited thereto.

For example, as a mark of a cell, an intracellular minute organ, a protein to be observed, gold nanoparticles can be used. The gold nanoparticles are gold nanoparticles having a particle diameter of nano order. The surface of the gold nanoparticles can be variously decorated, and the gold nanoparticles can be bound with a protein or a substrate. When a cell is labelled with gold nanoparticles, gold nanoparticles are added to a culture medium, so that the gold nanoparticles are captured in the cell by endocytosis. Alternatively, using a microelectrode, gold nanoparticles can be injected into a cell.

Further, when a protein is labelled with gold nanoparticles, an antibody against a protein to be observed is prepared, thereby performing immunostaining. At this step, gold nanoparticles are bound with a secondary antibody. Alternatively, when the protein is an enzyme, labelling can also be achieved by binding gold nanoparticles to the substrate for the enzyme.

Further, for example, an organism such as paramecium may be allowed to eat metal particles. Below, a description will be given to a process of preparing a specimen when the observation target is a paramecium.

First, gold nanoparticles are added to the culture medium cultivating a paramecium therein. As a result, the paramecium can be allowed to eat gold nanoparticles. The eaten gold nanoparticles are accumulated in the food vacuole of the paramecium.

Then, a specimen for a transmission electron microscope of the paramecium which has eaten the gold nanoparticles will be prepared. For example, a paramecium is fixed with glutaraldehyde and osmium tetroxide, and is dehydrated by ethanol series, followed by embedding in an epoxy resin. The paramecium embedded in resin is sliced to a thickness of 100 nm or lower by a microtome. The resulting section is placed on a supporting film. Then, the specimen section is double dyed with uranium acetate and lead citrate. By the above process, a specimen for a transmission electron microscope can be prepared.

Figure 12:
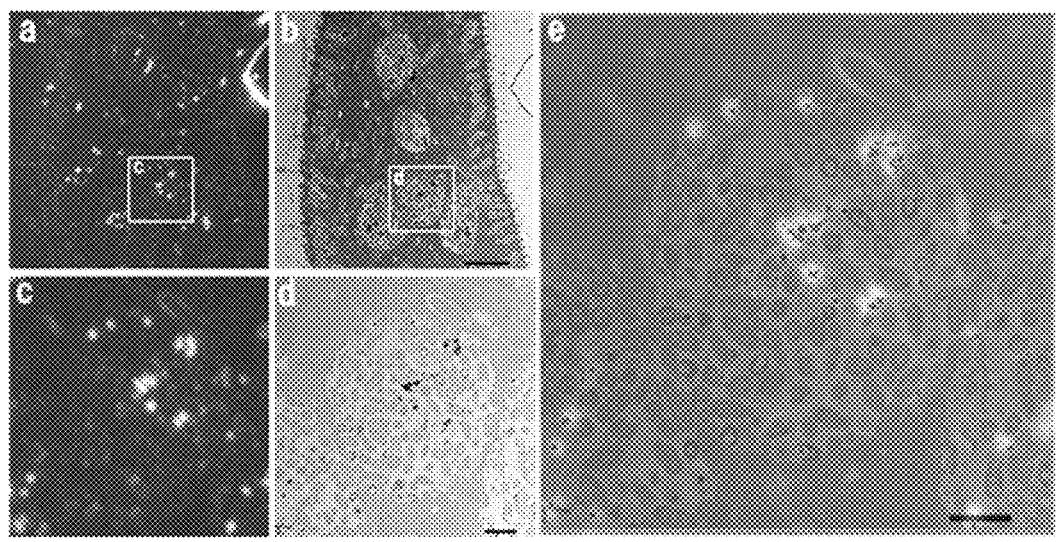
FIG. 12 illustrates optical microscope images of a paramecium and electron microscope images of the paramecium.

FIG. 12 illustrates optical microscope images (dark-field images) and TEM images of a paramecium. The image (a) illustrated in FIG. 12 is an optical microscope image (dark-field image), and the image (b) is a TEM image of the same visual field as that of (a). Further, an image (c) is an enlarged image of the image (a), and an image (d) is an enlarged image of the image (b). An image (e) is an image obtained by superimposing the image (c) on the image (d).

As described above, the gold nanoparticles as a mark were exposed to glutaraldehyde, osmium tetroxide, uranium oxide, or lead citrate during preparation of a specimen. However, in the optical microscope image illustrated in FIG. 12, orange scattered light from the gold nanoparticles are observed mixed with a scattered light from the paramecium. The region shining in orange in the image (c) is the food vacuole of the paramecium. For this reason, in the image (d), the food vacuole of the paramecium can be identified.

Further, as illustrated in the image (e), use of the gold nanoparticles as the mark enables precise alignment between the optical microscope image and the TEM image.

Herein, the label using gold particles is used in the immune electron microscopy. The immune electron microscopy is a process of visualizing the localization of the components forming a cell or a tissue using an immune reaction at the electron microscope level. The gold particles for use in the immune electron microscopy has a particle diameter of 5 nm or less so as to be penetrated into a cell or a tissue. However, with gold particles with a particle diameter of less than 10 nm, the scattered light is weak, so that in optical microscope observation, the scattered light cannot be observed.

For this reason, after penetrating gold nanoparticles labelled antibody into a cell or a tissue of an observation target, the particle diameter of the gold nanoparticles may be increased.

First, the cultured cell is fixed. Then, an anti-mitochondria antibody is allowed to react therewith as a primary antibody. Next, as a secondary antibody, a gold colloid labelled anti-Rabbit IgG antibody was allowed to react with the cultured cell. The gold colloid labelled anti-Rabbit IgG antibody includes gold nanoparticles bound to an anti-Rabbit IgG antibody. The particle diameter of the gold nanoparticles is 5 nm or less.

As described above, a primary antibody and a secondary antibody are allowed to react with the cultured cell. Then, the particle diameter of the gold nanoparticles is increased by the gold sensitization. Next, the cultured cell is dehydrated, and embedded in resin, and the resin embedded cell is sliced into thin sections by an ultramicrotome, or the like. The specimen section thus prepared is placed on a supporting film.

By the above process, it is possible to manufacture a specimen for a transmission electron microscope.

When the particle diameter of the gold nanoparticles is increased by the gold sensitization as described above, a variation in particle diameter among the gold nanoparticles is caused. For this reason, in the optical microscope image, a plurality of luminescent spots having different colors are observed, and in the electron microscope image, a plurality of metal particles having different particle diameters are observed. Therefore, the metal particles of the optical microscope image and the metal particles of the electron microscope image can be readily associated with each other. Accordingly, it is possible to perform alignment between the optical microscope image and the electron microscope image with precision.

As described above, after loading metal particles with a small particle diameter into the specimen, the particle diameter of the metal particles is increased. As a result, the visibility in optical microscope observation can be enhanced while keeping the penetration into the cell or the tissue.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An observation method comprising:
   preparing a specimen including, as a mark, a plurality of metal particles in which localized surface plasmon resonance is excited by irradiation with light;
   acquiring an optical microscope image by photographing the specimen with an optical microscope;
   acquiring an electron microscope image by photographing the specimen with an electron microscope;
   acquiring information of positions of the plurality of metal particles and information of color of scattered light from the plurality of metal particles due to localized surface plasmon resonance in the optical microscope image;
   estimating particle diameters of the plurality of metal particles from the information of the color of the scattered light from the metal particles due to localized surface plasmon resonance in the optical microscope image;

acquiring information of positions and particle diameters of the plurality of metal particles in the electron microscope image, wherein the particle diameters of the plurality of metal particles are determined by measuring the particle diameters of the plurality of metal particles in the electron microscope image;

determining information for associating the optical microscope image and the electron microscope image based on the information of the positions of the plurality of metal particles and the information of color of the scattered light from the plurality of metal particles due to localized surface plasmon resonance acquired from the optical microscope image and the information of the positions and the particle diameters of the plurality of metal particles acquired from the electron microscope image, wherein the plurality of metal particles observed in the optical microscope image and the plurality of metal particles observed in the electron microscope image are associated based on the estimated particle diameters and the particle diameters measured in the electron microscope image; and performing alignment between the optical microscope image and the electron microscope image based on the information for associating the optical microscope image and the electron microscope image, and forming a single image by superimposing the optical microscope image on the electron microscope image.

2. The observation method according to claim 1, wherein the plurality of metal particles are gold particles.

3. The observation method according to claim 1, wherein the optical microscope image is a dark-field image.

4. The observation method according to claim 1, wherein the specimen includes an observation target labelled with the plurality of metal particles.

5. The observation method according to claim 1, wherein preparing the specimen includes:

labelling an observation target with the plurality of metal particles; and increasing a size of the plurality of metal particles by sensitization.

6. An image processing device comprising:

an image acquisition unit configured to acquire an optical microscope image of a specimen including, as a mark, a plurality of metal particles in which localized surface plasmon resonance is excited by irradiation with light, and an electron microscope image of the specimen;

a first image information acquisition unit configured to acquire information of positions of the plurality of metal particles and information of color of scattered light from the plurality of metal particles due to localized surface plasmon resonance in the optical microscope image and estimate particle diameters of the plurality of metal particles from the information of the color of the scattered light from the metal particles due to localized surface plasmon resonance in the optical microscope image;

a second image information acquisition unit configured to acquire information of positions and particle diameters of the plurality of metal particles in the electron microscope image, wherein the particle diameters of the plurality of metal particles are determined by measuring the particle diameters of the plurality of metal particles in the electron microscope image;

a computation unit that determines information for associating the optical microscope image and the electron microscope image based on the information of the positions of the plurality of metal particles and the information of the color of the scattered light from the plurality of metal particles due to localized surface plasmon resonance acquired from the optical microscope image and the information of the positions and the particle diameters of the plurality of metal particles acquired from the electron microscope image, wherein the plurality of metal particles observed in the optical microscope image and the plurality of metal particles observed in the electron microscope image are associated based on the estimated particle diameters and the particle diameters measured in the electron microscope image; and an image forming unit that performs alignment between the optical microscope image and the electron microscope image based on the information for associating the optical microscope image and the electron microscope image, and forms a single image by superimposing the optical microscope image on the electron microscope image.

7. An electron microscope comprising the image processing device according to claim 6.

8. An observation method comprising:

preparing a specimen including, as a mark, a plurality of metal particles in which localized surface plasmon resonance is excited by irradiation with light;

acquiring an optical microscope image by photographing the specimen with an optical microscope;

acquiring an electron microscope image by photographing the specimen with an electron microscope;

acquiring information of positions and colors of the plurality of metal particles in the optical microscope image;

acquiring information of positions and particle diameters of the plurality of metal particles in the electron microscope image; and determining information for associating the optical microscope image and the electron microscope image based on the information of the positions and the colors of the plurality of metal particles acquired from the optical microscope image and the information of the positions and the particle diameters of the plurality of metal particles acquired from the electron microscope image, wherein preparing the specimen includes:

labelling an observation target with the plurality of metal particles; and increasing a size of the plurality of metal particles by sensitization.

9. The observation method according to claim 8, wherein the plurality of metal particles are gold particles.

10. The observation method according to claim 8, wherein the optical microscope image is a dark-field image.

11. The observation method according to claim 8, further comprising:

performing alignment between the optical microscope image and the electron microscope image based on the information for associating the optical microscope image and the electron microscope image, and forming a single image by superimposing the optical microscope image on the electron microscope image.

12. The observation method according to claim 8, wherein the specimen includes an observation target labelled with the plurality of metal particles.

13. An image processing device comprising:

an image acquisition unit configured to acquire an optical microscope image of a specimen including, as a mark, a plurality of metal particles in which localized surface plasmon resonance is excited by irradiation with light, and an electron microscope image of the specimen;

a first image information acquisition unit configured to acquire information of positions and colors of the plurality of metal particles in the optical microscope image;

a second image information acquisition unit configured to acquire information of positions and particle diameters of the plurality of metal particles in the electron microscope image; and a computation unit that determines information for associating the optical microscope image and the electron microscope image based on the information of the positions and the colors of the plurality of metal particles acquired from the optical microscope image and the information of the positions and the particle diameters of the plurality of metal particles acquired from the electron microscope image, wherein the specimen is prepared by:

labelling an observation target with the plurality of metal particles; and increasing a size of the plurality of metal particles by sensitization.

14. The image processing device according to claim 13, further comprising:

an image forming unit that performs alignment between the optical microscope image and the electron microscope image based on the information for associating the optical microscope image and the electron microscope image, and forms a single image by superimposing the optical microscope image on the electron microscope image.

15. An electron microscope comprising the image processing device according to claim 13.

* * * * *